US008611485B2

(12) United States Patent
Hann et al.

(10) Patent No.: US 8,611,485 B2
(45) Date of Patent: Dec. 17, 2013

(54) METHOD AND A DEVICE FOR CONTROLLING FREQUENCY SYNCHRONIZATION

(75) Inventors: Kenneth Hann, Espoo (FI); Mikko Laulainen, Helsinki (FI)

(73) Assignee: Tellabs Oy, Espoo (FI)

( * ) Notice: Subject to any disclaimer, the term of this patent is extended or adjusted under 35 U.S.C. 154(b) by 0 days.

(21) Appl. No.: 13/477,399

(22) Filed: May 22, 2012

(65) Prior Publication Data
US 2012/0300889 A1 Nov. 29, 2012

(30) Foreign Application Priority Data
May 25, 2011 (FI) ...................................... 20115515

(51) Int. Cl.
*H04L 7/02* (2006.01)
(52) U.S. Cl.
USPC ........... 375/362; 375/260; 375/262; 375/265; 375/267; 375/340; 375/343; 375/346; 375/350; 375/363; 375/364
(58) Field of Classification Search
USPC ......... 375/362, 260, 262, 265, 267, 340, 343, 375/346, 347, 350, 363, 364; 370/203, 204, 370/205, 208, 209, 210
See application file for complete search history.

(56) References Cited

U.S. PATENT DOCUMENTS

| | | | |
|---|---|---|---|
| 6,449,291 | B1 | 9/2002 | Burns et al. |
| 7,130,368 | B1 | 10/2006 | Aweya et al. |
| 2009/0052431 | A1 | 2/2009 | Kroener et al. |
| 2010/0074383 | A1 | 3/2010 | Lee et al. |
| 2010/0098111 | A1 | 4/2010 | Sun et al. |
| 2012/0254677 | A1* | 10/2012 | Hann et al. .................... 714/707 |

FOREIGN PATENT DOCUMENTS

| | | |
|---|---|---|
| EP | 0370170 A2 | 5/1990 |
| EP | 1455473 A2 | 9/2004 |
| EP | 2454936 A | 5/2009 |

OTHER PUBLICATIONS

Piqueira et al., "Comparing lock-in ranges and transient responses of second- and third- order phase-locked loops in master-slave clock distribution networks", International Journal of Electronics and Communications, 2008, vol. 62, pp. 459-463.
Extended European Search Report, dated Sep. 28, 2012, from corresponding EP application.
Finnish Search Report, dated Apr. 12, 2012, from corresponding Finnish application No. 20115515.

* cited by examiner

*Primary Examiner* — Dhaval Patel
(74) *Attorney, Agent, or Firm* — Young & Thompson

(57) ABSTRACT

A device for controlling frequency synchronization includes a processor for controlling a frequency-controlled clock signal on the basis of received timing messages so as to achieve frequency-locking between the frequency-controlled clock signal and a reference clock signal. For the purpose of finding such timing messages which have experienced similar transfer delays and thus are suitable for the frequency control, the processor is configured to control a phase-controlled clock signal on the basis of the timing messages so as to achieve phase-locking between the phase-controlled clock signal and the reference clock signal, and to select the timing messages to be used for the frequency control on the basis of phase-error indicators related to the phase control. Thus, the phase-controlled clock signal is an auxiliary clock signal that is utilized for performing the frequency control.

22 Claims, 2 Drawing Sheets

METHOD AND A DEVICE FOR CONTROLLING FREQUENCY SYNCHRONIZATION

FIELD OF THE INVENTION

The invention relates to a method and a control device for controlling frequency synchronization. Furthermore, the invention relates to a computer program for controlling frequency synchronization. Furthermore, the invention relates to network element, e.g. a router or a switch, of a data transfer network.

BACKGROUND

Data transfer networks include network elements such as, for example, routers, switches, and terminal devices which communicate with each other via data transfer links between the network elements. In many data transfer networks, there is a need to achieve synchronization between clock signals prevailing at various network elements of a data transfer network. The network elements can be configured to constitute master-slave pairs in order to distribute timing information within a data transfer network. Each slave network element controls its clock signal generator so that a reference clock signal prevailing at the corresponding master network element is regenerated in the slave network element on the basis of timing messages transferred from the master network element to the slave network element. The timing messages can be time-stamps contained by protocol data units "PDU" that can be, for example, data packets or data frames. Each time-stamp indicates the instantaneous time value at the transmission moment of the respective protocol data unit relating to the time-stamp under consideration, where the time value is based on the reference clock signal available at the master network element. It is also possible that the timing messages are timing packets or frames that are transmitted so that the time interval between transmission moments of two successive timing packets or frames is constant or otherwise known, when being measured with the reference clock signal available at the master network element. It is also possible that one or more time-stamps indicating the transmission moments of one or more timing messages are transferred in one or more data packets or frames transmitted after the one or more timing messages.

In many cases, the synchronization between network elements is accomplished as phase synchronization in which phase-error indicators are formed on the basis of reception moments of the timing messages transmitted in accordance with the reference clock signal, and a phase-controlled clock signal is controlled in accordance with the phase-error indicators so as to achieve phase-locking between the reference clock signal and the phase-controlled clock signal. The phase-controlled clock signal is, however, susceptible to disturbances caused by the transfer delay variation of the timing messages. Thus, the weakness of this approach is that it tends to over-react to certain transfer delay variation characteristics. For example, 24 hours network loading patterns and/or large changes in the delay variation may cause problems in certain technologies such as, for example, asymmetric digital subscriber loops "ADSL", microwave radios, and Gigabit passive optical networks "GPON".

In conjunction with certain applications, e.g. the mobile $3^{rd}$ generation "mobile 3G" and the succeeding Long Term Evolution "LTE" technologies, there is no phase error accumulation limit, thus phase synchronization is not an absolute requirement but the frequency synchronization is sufficient.

On the other hand, modern oven controlled crystal oscillators "OCXO" are capable of producing a stable clock signal and also the cost/performance ratio of OCXOs is continuously improving. Therefore, instead of using the phase synchronization that is susceptible to disturbances caused by the transfer delay variation, a better result can be achieved by using a high-quality OCXO and frequency synchronization with a sufficiently large update interval that the adverse effect of the transfer delay variation can be reduced.

The following notations and assumptions are made in order to illustrate the challenges related to the frequency synchronization. We assume that the frequency $f_s$ of a slave clock signal is $f_m + \epsilon f_m$, where is $f_m$ the frequency of the reference clock signal and $\epsilon$ is the relative frequency error. Furthermore, we assume that the time $t_s$ measured with the slave clock signal is $\theta$ when the time $t_m$ measured with the reference clock signal is zero. Hence, if the relative frequency error $\epsilon$ is assumed to be constant over time, we get:

$$t_s = (1+\epsilon)t_m + \theta. \qquad (1)$$

A first timing message $TM_1$ is transmitted from the master network element when $t_m = T_{m1}$. $TM_1$ experiences a transfer delay that is $d_1$ when measured with the reference clock signal. Hence, $TM_1$ arrives at the slave when $t_m = T_{m1} + d_1$. On the basis of Eq. (1), at this moment $t_s = (1+\epsilon)(T_{m1} + d_1) + \theta$. Hence, the arrival time at the slave is $T_{s1} = (1+\epsilon)(T_{m1} + d_1) + \theta$ when measured with the slave clock signal. A second timing message $TM_2$ is transmitted from the master network element when $t_m = T_{m2}$. $TM_2$ experiences a transfer delay that is $d_2$ when measured with the reference clock signal. Hence, the arrival time at the slave is $T_{s2} = (1+\epsilon)(T_{m2} + d_2) + \theta$ when measured with the slave clock signal.

The time interval measured with the reference clock signal between the transmission moments of $TM_1$ and $TM_2$ is $T_{m2} - T_{m1}$. The time interval measured with the slave clock signal between the reception moments of $TM_1$ and $TM_2$ is:

$$T_{s2} - T_{s1} = (1+\epsilon)(T_{m2}+d_2) + \theta - ((1+\epsilon)(T_{m1}+d_1)+\theta) = (1+\epsilon)(T_{m2}-T_{m1}) + (1+\epsilon)(d_2-d_1). \qquad (2)$$

The slave network element is aware of $T_{m2} - T_{m1}$ because the values $T_{m1}$ and $T_{m2}$ can be transferred from the master network element to the slave network element as time-stamps or, if the timing messages are transmitted at a constant or otherwise predetermined rate, the slave network element is able to form estimates for the values $T_{m1}$ and $T_{m2}$ and the unknown constant portion of the estimates gets cancelled when calculating the difference $T_{m2} - T_{m1}$. Hence, the slave network element is able to calculate the following quantity:

$$(T_{s2}-T_{s1}) - (T_{m2}-T_{m1}) = \epsilon(T_{m2}-T_{m1}) + (d_2-d_1) + \epsilon(d_2-d_1). \qquad (3)$$

This quantity can be used for adjusting the frequency of the slave clock signal if $\epsilon(T_{m2}-T_{m1}) >> (d_2-d_1) + \epsilon(d_2-d_1)$. The relative frequency errors can be for example $10^{-8} \ldots 10^{-7}$ and $T_{m2} - T_{m1}$ can be for example about $3 \times 10^4$ s. Hence, $\epsilon(T_{m2}-T_{m1})$ can be $3 \times 10^{-4} \ldots 10^{-3}$ s. The timing messages $TM_1$ and $TM_2$ should be selected to be such timing messages that the absolute value of the difference between the transfer delays $d_2 - d_1$ is at most about e.g. a third of the absolute value of $\epsilon(T_{m2}-T_{m1})$, i.e. $|d_2-d_1| < 10^{-4} \ldots 10^{-3}$ s. Hence, the timing messages $TM_1$ and $TM_2$ should be two such timing messages which have experienced a substantially similar transfer delay from the master network element to the slave network element. Delay estimates based on the frequency-controlled slave clock signal are not suitable for finding the timing messages which have experienced a substantially similar transfer delay, because for example estimates based on the slave clock signal for the delays experienced by $TM_1$ and $TM_2$ are:

$$T_{s1}-T_{m1}=d_1+\epsilon d_1+\epsilon T_{m1}+\theta, \text{ and}$$

$$T_{s2}-T_{m2}=d_2+\epsilon d_2+\epsilon T_{m2}+\theta, \quad (4)$$

where $T_{s1}$ and $T_{s2}$ are measured with the slave clock signal. Thus, the estimated delays comprise cumulated error components $\epsilon T_{m1}$ and $\epsilon T_{m2}$ that are proportional to the prevailing times $T_{m1}$ and $T_{m2}$ at the transmission moments of the corresponding timing messages $TM_1$ and $TM_2$.

US2009052431 discloses a method where the two timing messages which have experienced a substantially similar transfer delay are selected to be a first timing message that has, from among timing messages received within a first time window, the smallest estimated transfer delay and a second timing message that has, from among timing messages received within a second time window, the smallest estimated transfer delay. The method is based on the assumption that the minimum transfer delay from the master network element to the slave network element remains constant over time. This assumption is, however, not valid for example in a situation where a change in the routing conditions between the master and slave network elements has taken place. The time period between the timing messages used for the frequency control can be even 24 hours or more, and changes of the kind mentioned above are possible within such a long time period.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention there is provided a new method for controlling frequency synchronization. The method comprises:
  forming frequency-error indicators on the basis of first values of reception moments of received timing messages transmitted in accordance with a reference clock signal, the first values of the reception moments being expressed as time values based on a frequency-controlled clock signal, and
  controlling the frequency-controlled clock signal with the frequency-error indicators so as to achieve frequency-locking between the reference clock signal and the frequency-controlled clock signal,
wherein the method comprises, for the purpose of forming each of the frequency-error indicators, calculating a first quantity that is a difference between the first values of the reception moments of two such timing messages which have experienced a substantially similar transfer delay, calculating a second quantity that is a difference between reference moments of these two timing messages, and calculating a difference between the first and second quantities, and wherein the method comprises, for the purpose of finding two such timing messages which have experienced a substantially similar transfer delay:
  forming phase-error indicators on the basis of second values of the reception moments of the timing messages, the second values of the reception moments being expressed as time values based on a phase-controlled clock signal and each of the phase-error indicators being a difference between the second value of the reception moment of the respective timing message and the reference moment of this timing message,
  controlling the phase-controlled clock signal with the phase-error indicators so as to achieve phase-locking between the reference clock signal and the phase-controlled clock signal, and
  selecting the two timing messages from among the received timing messages on the basis of the phase-error indicators of the received timing messages.

As a corollary of the above-mentioned phase-locking, the accumulation of the phase-error between the reference clock signal and the phase-controlled clock signal is limited, whereas unlimited phase-errors are possible in the frequency-controlled clock signal even if the frequency error were small if the small frequency error does not change its sign for a long time. Hence, similar error accumulation as illustrated with the earlier-presented equations (4) cannot take place when the timing messages which have experienced a substantially similar transfer delay are searched for on the basis of the phase-error indicators related to the phase-controlled clock signal. The phase-error indicators may, however, differ from corresponding estimated transfer delays by an unknown constant but this is immaterial when searching for such timing messages which have experienced mutually similar transfer delays.

The reference moment of each timing message can be, for example, a sum of a constant phase-offset and a received time-stamp value related to that timing message. If the timing messages are transmitted at a constant or otherwise pre-determined rate, the reference moments of the timing messages can be formed locally so that the reference moments are values spaced at equal or otherwise pre-determined intervals.

In accordance with the second aspect of the invention there is provided a new control device for controlling frequency synchronization. The control device comprises a processor configured to:
  form frequency-error indicators on the basis of first values of reception moments of received timing messages transmitted in accordance with a reference clock signal, the first values of the reception moments being expressed as time values based on a frequency-controlled clock signal, and
  control the frequency-controlled clock signal with the frequency-error indicators so as to achieve frequency-locking between the reference clock signal and the frequency-controlled clock signal,
wherein the processor is configured, for the purpose of forming each of the frequency-error indicators, to calculate a first quantity that is a difference between the first values of the reception moments of two such timing messages which have experienced a substantially similar transfer delay, calculate a second quantity that is the difference between the reference moments of these two timing messages, and calculate a difference between the first and second quantities, and wherein the processor is configured, for the purpose of finding two such timing messages which have experienced a substantially similar transfer delay, to:
  form phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message, control the phase-controlled clock signal with the phase-error indicators so as to achieve phase-locking between the reference clock signal and the phase-controlled clock signal, and select the two timing messages from among the received timing messages on the basis of the phase-error indicators of the received timing messages.

In accordance with the third aspect of the invention there is provided a new network element. The network element comprises:

at least one ingress port for receiving timing messages, a controllable clock signal generator for producing a first controllable clock signal and a second controllable clock signal, the network element being arranged to operate in accordance with the first controllable clock signal, and a control device according to an embodiment of the invention for controlling the clock signal generator so that the first controllable clock signal is the frequency-controlled clock signal and the second controllable clock signal is the phase-controlled clock signal.

In accordance with the fourth aspect of the invention there is provided a new computer program for controlling frequency synchronization. The computer program comprises computer executable instructions for controlling a programmable processor to:

form frequency-error indicators on the basis of first values of reception moments of received timing messages transmitted in accordance with a reference clock signal, the first values of the reception moments being expressed as time values based on a frequency-controlled clock signal, and control the frequency-controlled clock signal with the frequency-error indicators so as to achieve frequency-locking between the reference clock signal and the frequency-controlled clock signal, wherein the computer program comprises computer executable instructions for controlling the programmable processor, for the purpose of forming each of the frequency-error indicators, to calculate a first quantity that is a difference between the first values of the reception moments of two such timing messages which have experienced a substantially similar transfer delay, calculate a second quantity that is the difference between the reference moments of these two timing messages, and calculate a difference between the first and second quantities, and wherein the computer program comprises computer executable instructions for controlling the programmable processor, for the purpose of finding two such timing messages which have experienced a substantially similar transfer delay, to:

form phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message, control the phase-controlled clock signal with the phase-error indicators so as to achieve phase-locking between the reference clock signal and the phase-controlled clock signal, and select the two timing messages from among the received timing messages on the basis of the phase-error indicators of the received timing messages.

A computer program product according to the invention comprises a non-volatile computer readable medium, e.g. a compact disc ("CD"), encoded with a computer program according to the invention.

A number of exemplifying embodiments of the invention are described.

Various exemplifying embodiments of the invention both as to constructions and to methods of operation, together with additional objects and advantages thereof, will be best understood from the following description of specific exemplifying embodiments when read in connection with the accompanying drawings.

The verb "to comprise" is used in this document as an open limitation that neither excludes nor requires the existence of also un-recited features. The features are mutually freely combinable unless otherwise explicitly stated.

BRIEF DESCRIPTION OF FIGURES

The exemplifying embodiments of the invention and their advantages are explained in greater detail below with reference to the accompanying drawings, in which.

DESCRIPTION OF EXEMPLIFYING EMBODIMENTS

Figure 1:
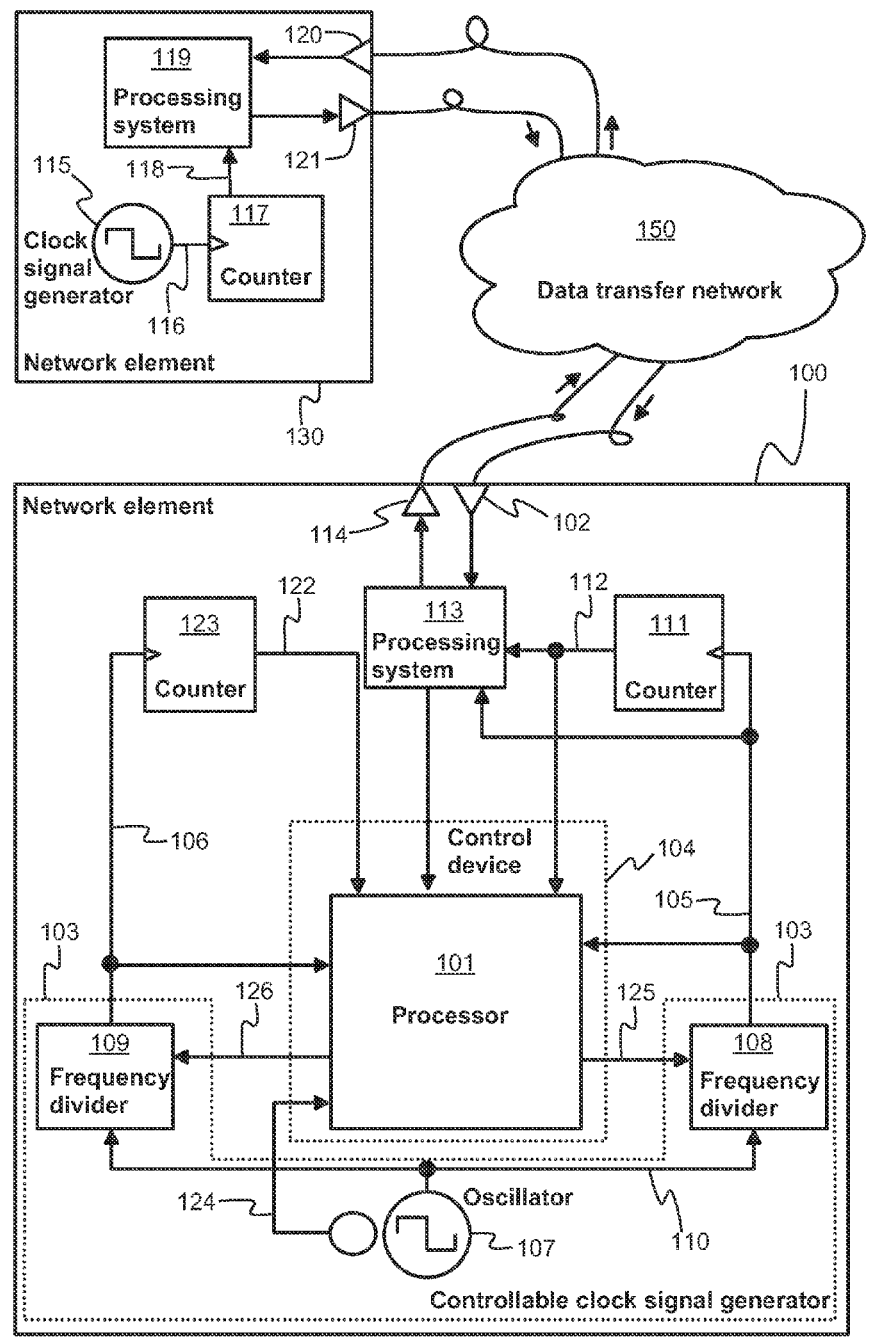
FIG. 1 shows a schematic illustration of an exemplifying data transfer system comprising a network element which is provided with a control device according to an embodiment of the invention for controlling frequency synchronization.

FIG. 1 shows a schematic illustration of an exemplifying data transfer system that comprises a network element 100 and a network element 130. The network elements 100 and 130 are connected to each other via a data transfer network 150 that may comprise several other network elements interconnected to each other via data transfer links. Each network element can be, for example, an Internet Protocol ("IP") router, an Ethernet switch, and/or a MultiProtocol Label Switching ("MPLS") switch. The network element 130 operates as a master network element and it is arranged to transmit timing messages to the network element 100 that operates as a slave network element. The network element 130 comprises a clock signal generator 115 arranged to generate a reference clock signal 116. The network element 130 comprises a counter 117 arranged to generate a signal 118 that represents the clock time prevailing at the network element 130. The network element 130 is arranged to transmit the timing messages in accordance with the reference clock signal 116. The network element 130 comprises a processing system 119 for performing control- and forwarding plane operations related to the data transfer protocols being used, e.g. IP, Ethernet, and/or MPLS. Furthermore, the network element 130 comprises at least one egress port 121 and advantageously at least one ingress port 120 for connecting to the data transfer network 150. The network element 100 comprises a controllable clock signal generator 103 for generating controllable clock signals. The network element 100 comprises a counter 111 arranged to generate a signal 112 that represents the clock time prevailing at the network element 100. The network element 100 comprises a processing system 113 for performing control- and forwarding plane operations related to data transfer protocols being used. Furthermore, the network element 100 comprises at least one ingress port 102 and advantageously at least one egress port 114 for connecting to the data transfer network 150.

The network element 100 comprises a control device 104 according to an embodiment of the invention for controlling the clock signal generator 103. The control device 104 comprises a processor 101 configured to form frequency-error indicators on the basis of first values of reception moments of the timing messages received at the ingress port 102. The first values of the reception moments are expressed as time values based on a frequency-controlled clock signal 105 that is a first controllable clock signal generated by the controllable clock signal generator 103. The above-mentioned first values of the reception moments are instantaneous values of the signal 112 at the reception times of the timing messages. The processor 101 is configured to control the frequency-controlled clock signal 105 with the frequency-error indicators so as to achieve frequency-locking between the reference clock signal 116 and the frequency-controlled clock signal 105.

The processor 101 is configured, for the purpose of forming each of the frequency-error indicators, to calculate a first quantity $T_{s2}-T_{s1}$ that is a difference between the first values of the reception moments of two such timing messages which have experienced a substantially similar transfer delay. The processor 101 is configured to calculate a second quantity $T'_{s2}-T'_{s1}$ that is the difference between the reference moments of these two timing messages. The processor 101 is further configured to calculate a difference $(T_{s2}-T_{se})-(T'_{s2}-T'_{s1})$ between the first and second quantities. The reference moment of each timing message can be a sum of a constant phase-offset and a time-stamp value indicating the transmission moment of that timing message. The time-stamp value is based on the reference clock signal 116 and it has been transferred from the network element 130 to the network element 100. The constant phase-offset can be positive, negative, or zero. Regardless of the constant phase-offset, the difference of the reference moments equals the difference of the corresponding time-stamp values. In the case where the timing messages are transmitted by the network element 130 at a constant or otherwise pre-determined rate, the processor 101 can be configured to form the reference moments locally so that the reference moments are values spaced at equal or otherwise known intervals. These locally formed reference moments correspond to the transmission moments of the timing messages related to the reference clock signal 116 except that the said reference moments have an unknown constant phase-shift with respect to the said transmission moments. This unknown constant phase-shift has, however, no effect in the above-mentioned difference of the reference moments $T'_{s2}-T'_{s1}$.

The above-mentioned difference $(T_{s2}-T_{s1})-(T'_{s2}-T'_{s1})$ is indicative of the frequency difference between the frequency-controlled clock signal 105 and the reference clock signal 116, because $T_{s2}-T_{s1}$ is the length of a first time interval measured with the frequency-controlled clock signal 105 and $T'_{s2}-T'_{s1}$ is the length of a second time interval measured with the reference clock signal 116, and the real temporal lengths of the first and second time intervals are substantially equal because the above-mentioned two timing messages have experienced a substantially similar transfer delay from the network element 130 to the network element 100. The processor 101 is configured to control the frequency-controlled clock signal 105 with the frequency-error indicators so as to achieve frequency-locking between the reference clock signal 116 and the frequency-controlled clock signal 105.

The processor 101 is configured to form phase-error indicators on the basis of second values of the reception moments of the timing messages. The second values of the reception moments are expressed as time values based on a phase-controlled clock signal 106 that is a second controllable clock signal generated by the controllable clock signal generator 103. The above-mentioned second values of the reception moments are instantaneous values of a signal 122 at the reception times of the timing messages. The signal 122 is an output signal of a counter 123 that is driven by the phase-controlled clock signal 106. Each of the phase-error indicators is a difference between the second value of the reception moment of the respective timing message and a reference moment of this timing message. The reference moment of each timing message can be a sum of a constant phase-offset and a time-stamp value indicating the transmission moment of that timing message, the time-stamp value having been transferred from the network element 130 to the network element 100. In a case where the timing messages are transmitted by the network element 130 at a constant or otherwise predetermined rate, the processor 101 can be configured to form the reference moments locally so that the reference moments are values spaced at equal or otherwise known intervals. The reference moments used for forming the phase-error indicators in the phase control can be the same or formed in the same way as those used for forming the frequency error indicators in the frequency control, or the reference moments for the phase control can be formed in a different way than those for the frequency control. The processor 101 is configured to control the phase-controlled clock signal 106 with the phase-error indicators so as to achieve phase-locking between the reference clock signal 116 and the phase-controlled clock signal 106, and, for the purpose of finding two such timing messages which have experienced a substantially similar transfer delay, select the two timing messages from among the received timing messages on the basis of the phase-error indicators of the received timing messages. In practice, the selection can be implemented for example so that the phase-error indicator of a first timing message is stored into a memory and, after a desired time period has elapsed, the phase-error indicators of second timing messages received thereafter are compared one-by-one with the stored phase-error indicator. If the difference between the stored phase-error indicator and the phase-error indicator of one of the second timing messages is below a pre-determined tolerance limit, these two timing messages can be deemed to be two such timing messages which have experienced a substantially similar transfer delay. It is also possible to store into the memory first phase-error indicators of timing messages received within a first time window, to store into the memory second phase-error indicators of timing messages received within a second time window that is later by a desired amount of time with respect to the first time window, and to select two phase-error indicators so that one of them is from among the first phase-error indicators, the other is from among the second phase-error indicators, and the difference between these two phase-error indicators is as small as possible. The phase-error indicators may differ from the corresponding estimated transfer delays by an unknown constant but this is immaterial when searching for such timing messages which have experienced similar transfer delays. The phase-controlled clock signal 106 could be considered an auxiliary clock signal which is utilized for finding such timing messages whose transfer delays have a substantially same temporal length.

In the exemplifying case shown in FIG. 1, the controllable clock signal generator 103 comprises an oscillator 107, a first numerically controllable frequency divider 108 for producing the frequency-controlled clock signal 105 from an output signal 110 of the oscillator, and a second numerically controllable frequency divider 109 for producing the phase-controlled clock signal 106 from the output signal of the oscillator. The oscillator 107 is preferably an oven controlled crystal oscillator "OCXO" that is capable of producing a stable clock signal. The numerically controllable frequency dividers 108 and 109 can be, for example, fractional N/N+1 dividers which are capable of producing a frequency division ratio N+δ, where δ can be from zero to one depending on a control signal 125 or 126. Both the poll and update intervals in the frequency control of the frequency-controlled clock signal 105 can be large when a stable OCXO is used. The time period between two timing messages which are used for the frequency control can be even 24 hours or more. This time interval can, however, involve several intermediate polls for stability checking purposes. The frequency changing rate, Hz/sec, in the frequency control is preferably limited to e.g. twice the maximum value specified by the manufacturer for the frequency-drift due to the aging of the OXCO. The gain and other parameters of the resulting closed frequency control loop are advantageously selected so that the control loop is heavily damped, i.e. there are no overshoots in the step response. The update interval of the phase-control of the phase-controlled clock signal 106 is preferably significantly shorter, e.g. by a factor of tens, hundreds or even thousands compared with that of the frequency control. The phase control loop should be responsive enough to track trends in delay. A suitable bandwidth could be about 1 mHz, i.e. a time constant of a few minutes. The phase control loop bandwidth should be chosen to minimize effects of temperature transients. The frequency control loop should advantageously be able to cope with periods of 12 to 24 hours, representative of daily loading profiles. The ratio of the time constants of the frequency and phase control loops is very large, e.g. 24 hours:5 min, i.e. about 300. This ratio of time constants is preferably at least 10, and more preferably at least 100.

It is also possible that the controllable clock signal generator 103 comprises a first controllable oscillator for producing the frequency-controlled clock signal 105, and a second controllable oscillator for producing the phase-controlled clock signal 106. The first and second controllable oscillators can be e.g. voltage controlled oscillators "VCO".

The network element 100 may comprise means for measuring from a system generating the frequency-controlled clock signal 105, i.e. from the controllable clock signal generator 103, a quantity 124 which is indicative of the stability of the frequency-controlled clock signal 105. The network element 100 may comprise, for example, a temperature sensor for measuring an internal and/or ambient temperature of the oscillator 107. In addition to or instead of the information about the internal and/or ambient temperature of the oscillator, the measured quantity 124 may contain, for example, information about the fluctuations of the supply voltage and/or the current consumption of the oscillator. In conjunction with certain types of oscillators, changes in the current consumption may indicate a risk that the temperature of the oscillator has varied.

In a control device according to an embodiment of the invention, the processor 101 is configured to monitor a deviation between the frequency-controlled clock signal 105 and the phase-controlled clock signal 106. In an embodiment of the invention, the processor is configured, for the purpose of monitoring the deviation, to calculate a difference between the first control signal 125 determining the frequency of the frequency-controlled clock signal and the second control signal 126 determining the frequency of the phase-controlled clock signal. In another embodiment of the invention, the processor is configured, for the purpose of monitoring the deviation, to compare the instantaneous phase of the frequency-controlled clock signal 105 to the instantaneous phase of the phase-controlled clock signal 106. The processor 101 is configured to detect, on the basis of the measured quantity 124, a change of local circumstances tending to cause frequency drifting of the frequency-controlled clock signal 105. For example, a change in the internal and/or ambient temperature of the oscillator 107 is an indication of a possible frequency drift in the frequency-controlled clock signal. The processor 101 is advantageously configured to replace or correct the frequency-controlled clock signal 105 with or on the basis of the phase-controlled clock signal 106 in response to a situation in which both the monitored deviation between the frequency- and phase-controlled clock signals and the detected change of the local circumstances show correlation confirming frequency drift of the frequency-controlled clock signal, i.e. the measured quantity 124 and the monitored deviation unanimously indicate a change in the operation of the oscillator 107. Thus, the phase-controlled clock signal 106 can be used together with the information about possible changes in the circumstances, e.g. temperature changes, for improving the quality of the frequency-controlled clock signal 105. An exemplifying case where the phase-controlled clock signal is not necessarily used for correcting or replacing the frequency-controlled clock signal is a situation in which rapid transfer delay variations have been detected. The transfer delay variations degrade the quality of the phase-controlled clock signal and therefore it is not advisable to replace or correct the frequency-controlled clock signal with or on the basis of the phase-controlled clock signal. Another exemplifying case where the phase-controlled clock signal is not necessarily used for correcting or replacing the frequency-controlled clock signal is a situation in which the rate-of-change of the phase difference between the frequency- and phase-controlled clock signals is so high that it cannot be explained by a measured temperature change. This indicates that there is transfer delay variation noise that degrades the quality of the phase-controlled clock signal and thus it is not advisable to replace or correct the frequency-controlled clock signal with or on the basis of the phase-controlled clock signal. However, if the frequency of the reference clock signal 116 has changed, the reference clock signal and the frequency-controlled clock signal would still continue to diverge, in which case the phase-controlled clock signal is advantageously used for achieving convergence in the new situation. In addition to using the phase-controlled clock signal for replacing or correcting the frequency-controlled clock signal during the normal operation of the network element 100, the phase-controlled clock signal can be used at the beginning of the operation of the network element 100 for providing initial synchronization during a starting phase and also in cases where a master network element has been changed.

In a control device according to an embodiment of the invention, the processor 101 is configured, for the purpose of correcting the frequency-controlled clock signal 105, to change the frequency of the frequency-controlled clock signal towards the frequency of the phase-controlled clock signal 106 with a pre-stored value chosen on the basis of the measured change of the internal and/or ambient temperature of the oscillator 107. Hence, the measured temperature determines the magnitude of the frequency adjustment and the phase-controlled clock signal determines the direction of the frequency adjustment, i.e. increase or decrease the frequency of the frequency controlled clock signal. At the beginning of the operation, the pre-stored values can be based on the manufacturer's specifications of the oscillator. Later, the pre-stored values can be adjusted on the basis of measured internal and/or ambient temperatures of the oscillator and corresponding frequency adjustments that, according to the phase-controlled clock signal, are to be made to the frequency-controlled clock signal. Appropriate filtering or other methods for removing disturbances are advantageously used when adjusting the pre-stored values.

In the exemplifying case illustrated in FIG. 1, the control device 104 is a part of a network element 100. It is also possible that the control device is a separate apparatus that is connected to the network element. The processor 101 of the control device may comprise one or more programmable processor units, one or more dedicated hardware circuits such as an application specific integrated circuit "ASIC", one or more field programmable logic circuits such as a field programmable gate array "FPGA", or a combination of these.

Figure 2:
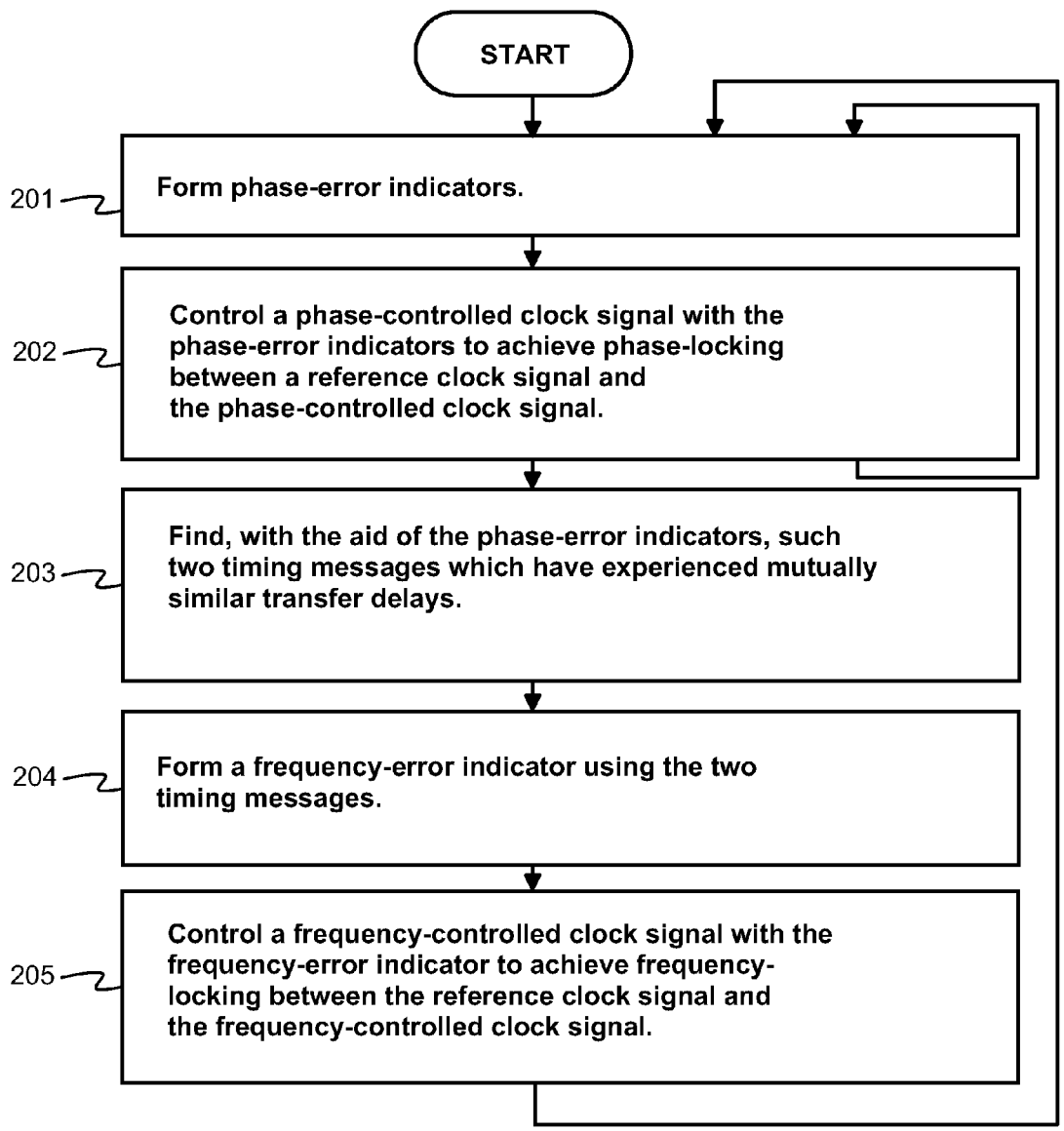
FIG. 2 shows a flow chart of a method according to an embodiment of the invention for controlling frequency synchronization.

FIG. 2 shows a flow chart of a method according to an embodiment of the invention for controlling frequency synchronization. The method comprises:
- in a phase 201, forming phase-error indicators on the basis of received timing messages transmitted in accordance with a reference clock signal,
- in a phase 202, controlling a phase-controlled clock signal with the phase-error indicators so as to achieve phase-locking between the reference clock signal and the phase-controlled clock signal,
- in a phase 203, selecting two timing messages from among the received timing messages on the basis of the phase-error indicators of the received timing messages so as to find two such timing messages which have experienced a substantially similar transfer delay,
- in a phase 204, forming a frequency-error indicator with the aid of the two timing messages, and
- in a phase 205, controlling the frequency-controlled clock signal with the frequency-error indicator so as to achieve frequency-locking between the reference clock signal and the frequency-controlled clock signal.

The method comprises, for the purpose of forming the frequency-error indicator, calculating a first quantity that is a difference between first values of the reception moments of the above-mentioned two timing messages, calculating a second quantity that is the difference between the reference moments of these two timing messages, and calculating a difference between the first and second quantities. The first values of the reception moments of the two timing messages are expressed as time values based on the frequency-controlled clock signal.

The above-mentioned phase-error indicators are formed on the basis of second values of the reception moments of the received timing messages, where the second values of the reception moments are expressed as time values based on the phase-controlled clock signal and each of the phase-error indicators is a difference between the second value of the reception moment of the respective timing message and a reference moment of this timing message.

In a method according to an embodiment of the invention, a sum of a constant phase-offset and a time-stamp value related to each timing message is the reference moment of that timing message.

In a method according to an embodiment of the invention, the reference moments of the timing messages are values spaced at equal or otherwise known intervals so that a difference between any two successive reference moments is constant or otherwise known.

A method according to an embodiment of the invention further comprises:

monitoring a deviation between the frequency-controlled clock signal and the phase-controlled clock signal,
detecting, on the basis of a quantity measured from a system generating the frequency-controlled clock signal, a change of circumstances tending to cause frequency drifting of the frequency-controlled clock signal, and
replacing or correcting the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

In a method according to an embodiment of the invention, the quantity measured from a system generating the frequency-controlled clock signal is indicative of at least an internal and/or ambient temperature of an oscillator of the system generating the frequency-controlled clock signal.

In a method according to an embodiment of the invention, the quantity measured from a system generating the frequency-controlled clock signal is indicative of at least changes of supply voltage of an oscillator of the system generating the frequency-controlled clock signal.

In a method according to an embodiment of the invention, the quantity measured from the system generating the frequency-controlled clock signal is indicative of at least changes of current consumption of the oscillator of the system generating the frequency-controlled clock signal.

A method according to an embodiment of the invention comprises, for the purpose of monitoring the deviation between the frequency-controlled clock signal and the phase-controlled clock signal, calculating a difference between a first control signal determining the frequency of the phase-controlled clock signal and a second control signal determining the frequency of the frequency-controlled clock signal.

A method according to an embodiment of the invention comprises, for the purpose of monitoring the deviation between the frequency-controlled clock signal and the phase-controlled clock signal, comparing the phase of the phase-controlled clock signal to the phase of the frequency-controlled clock signal.

A method according to an embodiment of the invention comprises, for the purpose of correcting the frequency-controlled clock signal, changing the frequency of the frequency-controlled clock signal towards the frequency of the phase-controlled clock signal with a pre-stored value chosen on the basis of a change in the measured internal and/or ambient temperature of the oscillator.

A computer program according to an embodiment of the invention comprises software modules for controlling frequency synchronization. The software modules comprise computer executable instructions for controlling the programmable processor to:
- form frequency-error indicators on the basis of first values of reception moments of received timing messages transmitted in accordance with a reference clock signal, the first values of the reception moments being expressed as time values based on a frequency-controlled clock signal, and
- control the frequency-controlled clock signal with the frequency-error indicators so as to achieve frequency-locking between the reference clock signal and the frequency-controlled clock signal,
wherein the software modules comprise computer executable instructions for controlling the programmable processor, for the purpose of forming each of the frequency-error indicators, to calculate a first quantity that is a difference between the first values of the reception moments of two such timing messages which have experienced a substantially similar transfer delay, calculate a second quantity that is the difference between the reference moments of these two timing messages, and calculate a difference between the first and second quantities, and wherein the software modules comprise computer executable instructions for controlling the programmable processor, for the purpose of finding two such timing messages which have experienced a substantially similar transfer delay, to:

form phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message, control the phase-controlled clock signal with the phase-error indicators so as to achieve phase-locking between the reference clock signal and the phase-controlled clock signal, and select the two timing messages from among the received timing messages on the basis of the phase-error indicators of the received timing messages.

The software modules can be, for example, subroutines and functions generated with a suitable programming language.

A computer program product according to an embodiment of the invention comprises a non-volatile computer readable medium, e.g. a compact disc ("CD"), encoded with the above-mentioned software modules.

A signal according to an embodiment of the invention is encoded to carry information defining a computer program according to an embodiment of the invention.

The specific examples provided in the description given above should not be construed as limiting. Therefore, the invention is not limited merely to the embodiments described above, many variants being possible.

What is claimed is:

1. A control device for controlling frequency synchronization, the control device comprising a processor configured to:

form frequency-error indicators on the basis of first values of reception moments of received timing messages transmitted in accordance with a reference clock signal, the first values of the reception moments being expressed as time values based on a frequency-controlled clock signal, and control the frequency-controlled clock signal with the frequency-error indicators so as to achieve frequency-locking between the reference clock signal and the frequency-controlled clock signal, wherein the processor is configured, for the purpose of forming each of the frequency-error indicators, to calculate a first quantity that is a difference between the first values of the reception moments of two such timing messages which have experienced a substantially similar transfer delay, calculate a second quantity that is a difference between reference moments of these two timing messages, and calculate a difference between the first and second quantities, and the processor is configured, for the purpose of finding two such timing messages which have experienced a substantially similar transfer delay, to:

form phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message, control the phase-controlled clock signal with the phase-error indicators so as to achieve phase-locking between the reference clock signal and the phase-controlled clock signal, and select the two timing messages from among the received timing messages on the basis of the phase-error indicators of the received timing messages.

2. The control device according to claim 1, wherein the processor is further configured to:

monitor a deviation between the frequency-controlled clock signal and the phase-controlled clock signal, detect, on the basis of a quantity measured from a system generating the frequency-controlled clock signal, a change of circumstances tending to cause frequency drifting of the frequency-controlled clock signal, and replace or correct the frequency-controlled clock signal with or on the basis of the phase-controlled clock signal in response to a situation in which both the monitored deviation between the frequency and phase-controlled clock signals and the detected change of circumstances show correlation confirming frequency drift of the frequency-controlled clock signal.

3. The control device according to claim 1, wherein a sum of a constant phase-offset and a time-stamp value related to each timing message is the reference moment of that timing message.

4. The control device according to claim 1, wherein the reference moments of the timing messages are values spaced at equal intervals so that a difference between any two successive reference moments is constant.

5. The control device according to claim 2, wherein the quantity measured from a system generating the frequency-controlled clock signal is indicative of at least an internal and/or ambient temperature of an oscillator of the system generating the frequency-controlled clock signal.

6. The control device according to claim 2, wherein the quantity measured from a system generating the frequency-controlled clock signal is indicative of at least one of the following: changes of supply voltage of an oscillator of the system generating the frequency-controlled clock signal, changes of current consumption of the oscillator.

7. The control device according to claim 2, wherein the processor is configured, for the purpose of monitoring the deviation between the frequency-controlled clock signal and the phase-controlled clock signal, to calculate a difference between a first control signal determining the frequency of the phase-controlled clock signal and a second control signal determining the frequency of the frequency-controlled clock signal.

8. The control device according to claim 2, wherein the processor is configured, for the purpose of monitoring the deviation between the frequency-controlled clock signal and the phase-controlled clock signal, to compare the phase of the phase-controlled clock signal to the phase of the frequency-controlled clock signal.

9. The control device according to claim 5, wherein the processor is configured, for the purpose of correcting the frequency-controlled clock signal, to change the frequency of the frequency-controlled clock signal towards the frequency of the phase-controlled clock signal with a pre-stored value chosen on the basis of a change in the measured internal and/or ambient temperature of the oscillator.

10. A network element comprising:

at least one ingress port for receiving timing messages, and a controllable clock signal generator for producing a first controllable clock signal and a second controllable clock signal, the network element being arranged to operate in accordance with the first controllable clock signal, wherein the network element further comprises a control device for controlling the clock signal generator, the control device comprising a processor configured to:

form frequency-error indicators on the basis of first values of reception moments of received timing messages transmitted in accordance with a reference clock signal, the first values of the reception moments being expressed as time values based on the first controllable clock signal, and control the first controllable clock signal with the frequency-error indicators so as to achieve frequency-locking between the reference clock signal and the first controllable clock signal, wherein the processor is configured, for the purpose of forming each of the frequency-error indicators, to calculate a first quantity that is a difference between the first values of the reception moments of two such timing messages which have experienced a substantially similar transfer delay, calculate a second quantity that is a difference between reference moments of these two timing messages, and calculate a difference between the first and second quantities, and the processor is configured, for the purpose of finding two such timing messages which have experienced a substantially similar transfer delay, to:

form phase-error indicators on the basis of second values of the reception moments of the timing messages, the second values of the reception moments being expressed as time values based on the second controllable clock signal and each of the phase-error indicators being a difference between the second value of the reception moment of the respective timing message and a reference moment of this timing message, control the second controllable clock signal with the phase-error indicators so as to achieve phase-locking between the reference clock signal and the second controllable clock signal, and select the two timing messages from among the received timing messages on the basis of the phase-error indicators of the received timing messages.

11. The network element according to claim 10, wherein the controllable clock signal generator comprises an oscillator and a first numerically controllable frequency divider for producing the first controllable clock signal from an output signal (110) of the oscillator and a second numerically controllable frequency divider (109) for producing the second controllable clock signal from the output signal of the oscillator.

12. The network element according to claim 10, wherein the network element is at least one of the following: an Internet Protocol ("IP") router, an Ethernet switch, a MultiProtocol Label Switching ("MPLS") switch.

13. A method for controlling frequency synchronization, the method comprising:

forming frequency-error indicators on the basis of first values of reception moments of received timing messages transmitted in accordance with a reference clock signal, the first values of the reception moments being expressed as time values based on a frequency-controlled clock signal, and controlling the frequency-controlled clock signal with the frequency-error indicators so as to achieve frequency-locking between the reference clock signal and the frequency-controlled clock signal, wherein the method comprises, for the purpose of forming each of the frequency-error indicators, calculating a first quantity that is a difference between the first values of the reception moments of two such timing messages which have experienced a substantially similar transfer delay, calculating a second quantity that is a difference between reference moments of these two timing messages, and calculating a difference between the first and second quantities, and the method comprises, for the purpose of finding two such timing messages which have experienced a substantially similar transfer delay:

forming phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message, controlling the phase-controlled clock signal with the phase-error indicators so as to achieve phase-locking between the reference clock signal and the phase-controlled clock signal, and selecting the two timing messages from among the received timing messages on the basis of the phase-error indicators of the received timing messages.

14. The method according to claim 13, wherein the method further comprises:

monitoring a deviation between the frequency-controlled clock signal and the phase-controlled clock signal, detecting, on the basis of a quantity measured from a system generating the frequency-controlled clock signal, a change of circumstances tending to cause frequency drifting of the frequency-controlled clock signal, and replacing or correcting the frequency-controlled clock signal with or on the basis of the phase-controlled clock signal in response to a situation in which both the monitored deviation between the frequencyand phase-controlled clock signals and the detected change of circumstances show correlation confirming frequency drift of the frequency-controlled clock signal.

15. The method according to claim 13, wherein a sum of a constant phase-offset and a time-stamp value related to each timing message is the reference moment of that timing message.

16. The method according to claim 13, wherein the reference moments of the timing messages are values spaced at equal intervals so that a difference between any two successive reference moments is constant.

17. The method according to claim 14, wherein the quantity measured from a system generating the frequency-controlled clock signal is indicative of at least an internal and/or ambient temperature of an oscillator of the system generating the frequency-controlled clock signal.

18. The method according to claim 14, wherein the quantity measured from a system generating the frequency-controlled clock signal is indicative of at least one of the following: changes of supply voltage of an oscillator of the system generating the frequency-controlled clock signal, changes of current consumption of the oscillator.

19. The method according to claim 14, wherein the method comprises, for the purpose of monitoring the deviation between the frequency-controlled clock signal and the phase-controlled clock signal, calculating a difference between a first control signal determining the frequency of the phase-controlled clock signal and a second control signal determining the frequency of the frequency-controlled clock signal.

20. The method according to claim 14, wherein the method comprises, for the purpose of monitoring the deviation between the frequency-controlled clock signal and the phase-controlled clock signal, comparing the phase of the phase-controlled clock signal to the phase of the frequency-controlled clock signal.

21. The method according to claim 17, wherein the method comprises, for the purpose of correcting the frequency-controlled clock signal, changing the frequency of the frequency-controlled clock signal towards the frequency of the phase-controlled clock signal with a pre-stored value chosen on the basis of a change in the measured internal and/or ambient temperature of the oscillator.

22. A non-transitory computer readable medium encoded with a computer program for controlling frequency synchronization, the computer program comprising computer executable instructions for controlling a programmable processor to:
form frequency-error indicators on the basis of first values of reception moments of received timing messages transmitted in accordance with a reference clock signal, the first values of the reception moments being expressed as time values based on a frequency-controlled clock signal, and
control the frequency-controlled clock signal with the frequency-error indicators so as to achieve frequency-locking between the reference clock signal and the frequency-controlled clock signal,
wherein the computer program comprises computer executable instructions for controlling the programmable processor, for the purpose of forming each of the frequency-error indicators, to calculate a first quantity that is a difference between the first values of the reception moments of two such timing messages which have experienced a substantially similar transfer delay, calculate a second quantity that is a difference between reference moments of these two timing messages, and calculate a difference between the first and second quantities, and the computer program comprises computer executable instructions for controlling the programmable processor, for the purpose of finding two such timing messages which have experienced a substantially similar transfer delay, to:
form phase-error indicators on the basis of second values of the reception moments of the timing messages, the second values of the reception moments being expressed as time values based on a phase-controlled clock signal and each of the phase-error indicators being a difference between the second value of the reception moment of the respective timing message and a reference moment of this timing message,
control the phase-controlled clock signal with the phase-error indicators so as to achieve phase-locking between the reference clock signal and the phase-controlled clock signal, and
select the two timing messages from among the received timing messages on the basis of the phase-error indicators of the received timing messages.

* * * * *